(12) United States Patent
Horikiri

(10) Patent No.: US 7,687,991 B2
(45) Date of Patent: Mar. 30, 2010

(54) ORGANIC ELECTROLUMINESCENCE DEVICE

(75) Inventor: Tomonari Horikiri, Sagamihara (JP)

(73) Assignee: Canon Kabushiki Kaisha, Tokyo (JP)

( * ) Notice: Subject to any disclaimer, the term of this patent is extended or adjusted under 35 U.S.C. 154(b) by 306 days.

(21) Appl. No.: 11/766,899

(22) Filed: Jun. 22, 2007

(65) Prior Publication Data

US 2008/0012473 A1 Jan. 17, 2008

(30) Foreign Application Priority Data

Jul. 12, 2006 (JP) .............................. 2006-191123

(51) Int. Cl.
*H05B 33/00* (2006.01)
(52) U.S. Cl. ..................... 313/512; 313/504; 313/506
(58) Field of Classification Search .................. None
See application file for complete search history.

(56) References Cited

U.S. PATENT DOCUMENTS

2006/0003139 A1* 1/2006 Choi et al. ................... 428/76
2006/0220550 A1* 10/2006 Harada ....................... 313/512

FOREIGN PATENT DOCUMENTS

| JP | 2002-008852 | 1/2002 |
|----|-------------|--------|
| JP | 2005-079056 | 3/2005 |

\* cited by examiner

*Primary Examiner*—Ashok Patel
(74) *Attorney, Agent, or Firm*—Fitzpatrick, Cella, Harper & Scinto

(57) ABSTRACT

The present invention provides an organic EL device including: a substrate; a stacked structure having at least a first electrode, a light-emitting layer and a second electrode; a sealing member for sealing the substrate and the stacked structure; and a filling layer which enables easy optical adjustment and has optical properties equal to the optical properties of surrounding materials while preventing moisture from entering in the EL device, wherein a layer containing a water-polymerizable monomer is provided between the stacked structure and the sealing member.

6 Claims, 1 Drawing Sheet

ORGANIC ELECTROLUMINESCENCE DEVICE

BACKGROUND OF THE INVENTION

1. Field of the Invention

The present invention relates to an organic electroluminescence device (hereinafter, simply abbreviated as "organic EL device") used for a flat device display or the like.

2. Description of the Related Art

In recent years, an organic EL device as a self-luminous device for a flat device display has received attention. Organic EL devices are classified into a top emission type and a bottom emission type depending on device structure.

An organic EL device easily causes characteristic degradation due to water or oxygen. It is known that even a small amount of water may cause peeling of an organic compound layer and an electrode layer, and produce dark spots. Therefore, an organic EL device is sealed with a sealing member (for example, etching glass cover) having a moisture absorbent placed inside, and the moisture absorbent removes water and oxygen infiltrating into the organic EL device, thereby ensuring a lifetime of the organic EL device.

As one example, Japanese Patent Application Laid-Open No. 2002-008852 discloses a technique in which a deoxidized and dehydrated portion having an alkali metal or an alkali earth metal is formed at any position inside a sealed space.

Further, Japanese Patent Application Laid-Open No. 2005-079056 discloses a technique in which ceramics such as zeolite or a metal oxide such as calcium oxide is placed inside a sealed space.

The above technique of Japanese Patent Application Laid-Open No. 2002-008852 is effective in a bottom emission type organic EL device since an alkali metal or an alkali earth metal has a metallic luster. However, it is difficult to employ the technique in a top emission type organic EL device since light extraction efficiency and the efficiency of deoxidization or dehydration are mutually contradictory. Further, since film formation of these materials is performed by a sputtering method or the like, these materials have a problem in costs.

The above technique of Japanese Patent Application Laid-Open No. 2005-079056 has a problem of having difficulty in optical adjustment when the technique is adopted for a top emission type organic EL device, because the metal oxide is a solid particle and has a large size in shape.

SUMMARY OF THE INVENTION

An object of the present invention is to provide an organic EL device having a filling layer, which has optical properties equal to the optical properties of surrounding materials and enables easy optical adjustment while preventing water from entering in the device.

The present invention provides an organic electroluminescence device including: a substrate; a stacked structure having at least a first electrode, a light-emitting layer and a second electrode which are stacked on the substrate; a sealing member for sealing the substrate and the stacked structure; and a layer containing a monomer that can be polymerized by water (hereinafter, refereed to as "water-polymerizable monomer") between the stacked structure and the sealing member.

According to the present invention, a layer disposed between a stacked structure and a sealing member contains a water-polymerizable monomer, and thus the present invention can provide a layer (for example, filling layer) that is optically excellent and has a water absorption property. Further, use of this layer can provide an organic EL device excellent in display characteristics and lifetime characteristics.

Further features of the present invention will become apparent from the following description of exemplary embodiments with reference to the attached drawings.

DESCRIPTION OF THE EMBODIMENTS

Figure 1:
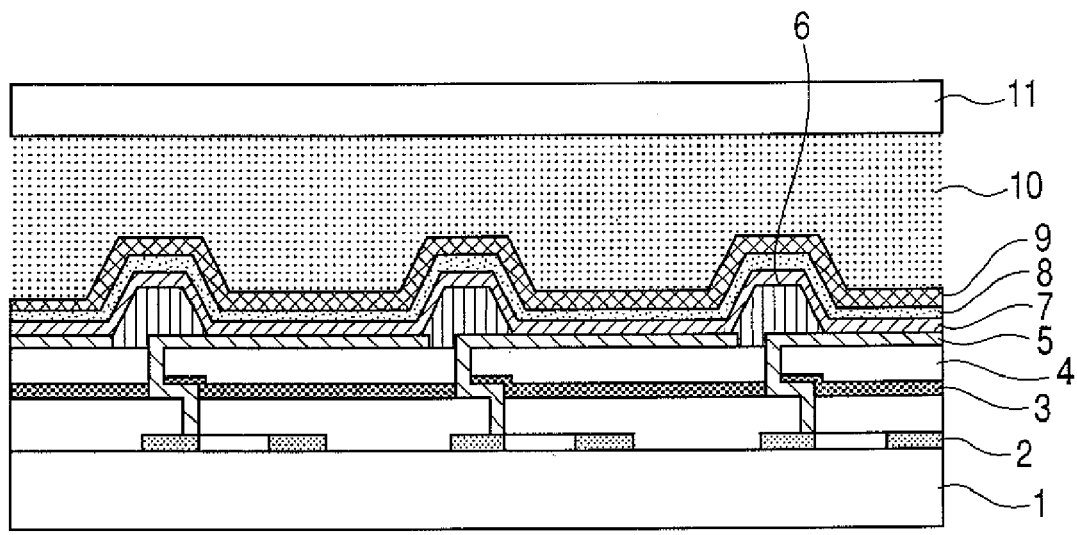
FIG. 1 is a schematic cross-sectional view of one embodiment of the present invention, in which a filling layer is formed above a passivation layer of a top emission type organic EL device.

Hereafter, embodiments of the present invention are described by referring to the drawings, but the present invention is not limited to these embodiments.

First Embodiment

FIG. 1 is a schematic view illustrating a part of cross section of a top emission type organic EL device of the present invention.

First, reference numerals in the drawings are described.

There are provided a glass substrate 1, a TFT (thin-film transistor) 2, an insulating film 3, an organic planarizing film 4, an opaque electrode 5, a device isolation film 6, an organic compound layer 7, a transparent electrode 8, a passivation layer 9, a filling layer 10, a cover glass 11 and a sealing can 12.

On the glass substrate (substrate) 1, the TFT 2, the insulating film 3 and the organic planarizing film 4 are formed by stacking in this order, and thereon a Cr electrode which is an opaque electrode 5 as pixel (device) unit is formed. The surrounding of each pixel is covered with a device isolation film 6 made of polyimide. Above this substrate, an organic compound layer 7 having a hole transport layer, a light-emitting layer, an electron transport layer and an electron injection layer in this order from the substrate side is formed. On the organic compound layer, a transparent electrode 8 is formed to provide a stacked structure. Further, a passivation layer 9 as a protective layer is formed to completely cover the upper part (in this embodiment, transparent electrode 5, organic compound layer 7, device isolation film 6 and organic planarizing layer 4 except a lead-out electrode) of the stacked structure. The upper part including this passivation layer 9 is covered with a cover glass 11 as a sealing member, and the periphery of the cover glass 11 is sealed with a sealing material (not shown). A filling agent (layer) 10 is inserted between this cover glass 11 and the passivation layer 9.

The filling layer 10 of the present invention contains a water-polymerizable monomer and a polymer obtained by polymerization of the monomer. These monomers can function as a polymerization initiator by addition of water to the monomers, and these monomers have a property of polymerization with other monomers. This polymerization process consumes water, thus exhibiting a function of a moisture absorbent.

As the water-polymerizable monomer, monomers polymerizable through ionic polymerization as represented by cationic polymerization may be exemplified. In a polymerization reaction mechanism, one carbon atom of a vinyl group as a polymerizable group has two strong electron attracting groups, this allows easy reaction with a relatively weak nucleophilic agent such as water or alcohols, and the reaction product functions as an initiator for polymerization with other monomers. The above monomers specifically include cyanoacrylate-based monomers, vinylether-based monomer, and the like. Further, monomers obtained by substituting each cyano group of cyanoacrylate-based monomers by a fluorine group, a chlorine group, or the like having similar electron attracting property. More specific examples of the monomer include: alkyl-2-cyanoacrylate such as octyl-2-cyanoacrylate, ethyl-2-cyanoacrylate and propyl-2-cyanoacrylate; and fluorine-containing 2-cyanoacrylate such as trifluoroethyl-2-cyanoacrylate, dimethyl-hexafluoropentyl-2-cyanoacrylate, and octafluoropentyl-2-cyanoacrylate. Further, examples thereof include bis(2-cyanoacrylate) such as octanediol-bis(2-cyanoacrylate) and hexanediol-bis(cyanoacrylate); diglycidyl(2-cyanoacrylate); aryl(2-cyanoacrylate); and alkyl vinyl ether such as ethyl vinyl ether, butyl vinyl ether, and methyl vinyl ether. Furthermore, examples thereof include fluoroalkyl fluoroacrylate such as trifluoroethyl-α-fluoroacrylate, tert-butyl-2-fluoroacrylate, and hexafluoroisopropyl-2-fluoroacrylate.

Further, an additive may be added for promoting ionic polymerization. Examples of the additive include Lewis acids such as tin chloride, zinc chloride, hydrogen iodide, ethylaluminum dichloride. The additive may be added in an amount of from 0.0001% by weight or more and 20% by weight or less, preferably from 0.01% by weight or more and 5% by weight or less.

In the polymerization reaction mechanism of water-polymerizable monomers in the present invention, monomers reacted with a relatively weak nucleophilic agent such as water or alcohols function as initiators for polymerization with other monomers as described above. One exemplary reaction formula of this reaction is shown below.

[Formula 1]

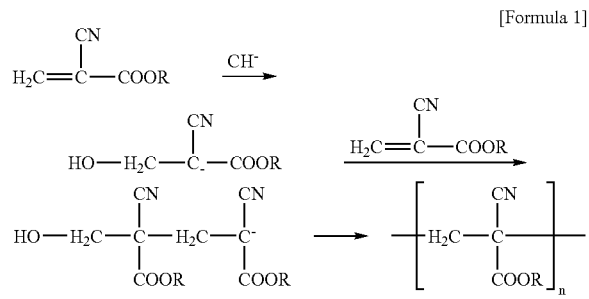

Therefore, a larger number of reaction starting points increases water consumption. The water-polymerizable monomers of the present invention can be dispersed in a filling layer as fine droplets to increase contact areas with water. The size of fine droplets is dependent on a refractive index difference between water-polymerizable monomers to be used and a main ingredient of a filling agent described below, and thus the size thereof cannot be restricted. Preferably, fine droplets cannot visually be recognized. When computed as a diameter of circle, for example, the size may be 1 mm or less, preferably 10 μm or less, more preferably 400 nm or less. Fine droplets with a size of 400 nm or less include fine droplets having such a molecule-level size as to be compatible with the main ingredient of the filling layer in the filling layer. The main ingredient of the filling agent will be described below, but examples thereof include organic resins.

In comparison with solid particles of metal oxides, water-polymerizable monomers of the present invention have features that: the monomers are easily blended with the main ingredient of the filling layer since they are organic matters similar to the main ingredient of the filling layer; the droplets of the monomers can be easily formed in a size reduced to the level at which their shapes are visually unrecognizable; and the monomers do not require countermeasures to prevent aggregation unlike for solid particles.

Reasons for dispersing the monomers as fine droplets are as follows.

It is known that water infiltrating into an organic EL device comes to a transparent electrode 8 or a device isolation film 4 through a filling layer from outside, and infiltrates into a light-emitting layer. In a structure in which water-polymerizable monomers are disposed at an interface between the filling layer 10 and a passivation layer 9, or an interface between the filling layer 10 and a cover glass 11, only water infiltrating through a surface of the filling layer can be captured. However, in a structure of the present invention in which water-polymerizable monomers are dispersed in the filling layer as fine droplets, water entering from inside of the filling layer can efficiently be captured in addition to water entering from the surface of the filling layer, thereby enabling efficient dehydration.

Polymer products obtained by polymerization of water-polymerizable monomers are resultant products by water absorption. Thus, the polymerization degree cannot be restricted and the polymerization degree may be 2 or more. The polymer products also include oligomers (molecular weight: less than 1000) and polymers (molecular weight: 1000 or more). Preferably, the fine droplet size may be adjusted so that more oligomers (low molecular weights) are obtained to increase water consumption.

As the main ingredient of the filling layer 10, organic resins may be exemplified. The main ingredient has to suffice indispensable requirements: to have a low water content; and to allow the water-polymerizable monomers to be dispersed. Further, when the filling layer is used for a top emission type organic EL device, the main ingredient additionally has to be transparent enough to have a good optical transparency. Specific examples thereof include styrene resins, acrylic resins, vinyl resins and transparent polyimide resin.

Further, water-polymerizable monomers may bind chemically to an organic resin as the main ingredient. For example, when glycidyl cyanoacrylate is used as the water-polymerizable monomer and an organic resin as the main ingredient has alcoholic hydroxyl groups, etc. therein, these groups form epoxy bonds with each other, thus producing a main ingredient of a filling agent having ionically polymerizable groups.

For use in a top emission type organic EL device, a filling layer 10 of the present invention can be transparent. Further, for efficient light extraction from an organic compound layer 7, the filling layer 10 preferably has a refractive index of 1.3 or more, more preferably 1.4 or more. The refractive index of the filling layer falls within the range between the refractive index of a layer in contact with the filling layer, namely the refractive index of a sealing member, and the refractive index of a layer present on an external surface of a stacked structure in contact with the filling layer, or the refractive index of the filling layer is equal to one of the above refractive indexes. This enables light radiated from a light-emitting layer to be optically and efficiently extracted to a display surface of the device. In this embodiment, the refractive index of the filling layer 10 may fall within the range between the refractive index of a cover glass 11 adjacent to the filling layer 10 and the refractive index of a passivation layer 9. Exemplary materials used for the cover glass 11 include, in addition to glass, polycarbonate (PC), polyethylene terephthalate (PET) and polymethylmethacrylate (PMMA). Optical glass, PC, PET and PMMA have refractive indexes of 1.50, 1.59, 1.60 and 1.49, respectively. Further, silicon nitride and silicon oxide may be exemplified as a material used for the passivation layer. These materials have a refractive index of 1.4 to 2.0. Accordingly, the filling layer 10 of this embodiment may have a refractive index of from 1.4 to 2.0.

Second Embodiment

Figure 2:
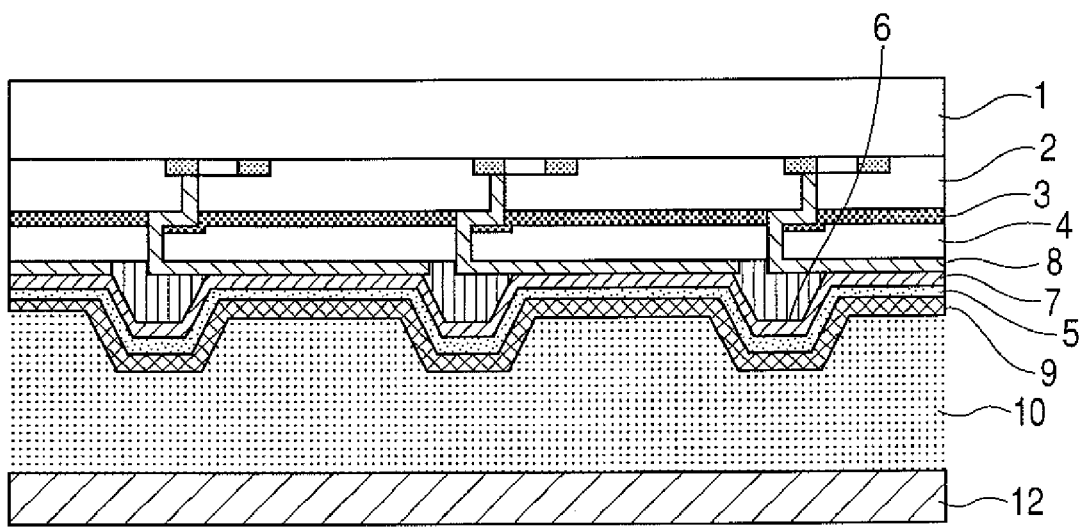
FIG. 2 is a schematic cross-sectional view of one embodiment of the present invention, in which a filling layer is formed below a passivation layer of a bottom emission type organic EL device.

FIG. 2 is a schematic view illustrating a part of cross section of a bottom emission type organic EL device of the present invention.

In the organic EL device shown in FIG. 2, a TFT 2, an insulating film 3 and an organic planarizing film 4 are formed in this order under a glass substrate 1, and on the organic planarizing film, an ITO electrode as a transparent electrode (first electrode) 8 for pixel unit is formed. The surrounding of each pixel is covered with a device isolation film 6 made of polyimide. Below this substrate, an organic compound layer 7 having a hole transport layer, a light-emitting layer, an electron transport layer and an electron injection layer in this order is formed. Under the organic compound layer, an opaque electrode (second electrode) 5 and a passivation layer 9 are formed in this order. Then, the transparent electrode 8 except a lead-out electrode, the organic compound layer 7, the device isolation film 6 and the organic planarizing film 4 are sealed by an aluminum container (sealing can 12) filled with a filling agent (layer) 10 so as to be completely covered with the container.

The filling layer 10 of the present invention used for this bottom emission type organic EL device corresponds to a filling layer used for the above top emission type organic EL device. However, the filling layer 10 is present behind the organic compound layer 7 from a viewpoint of an observer, and thus there is no optical limitation.

Further, the sealing member of the present invention is used for the purpose of preventing water and oxygen from entering the organic compound layer 7. Exemplary materials of the sealing member include glass, metals and organic resins, and these can be used as etching glass, cover glass, a metal can and a resin film.

Furthermore, the protective layer (passivation layer) 9 of the present invention is used for the purpose of protecting an external surface of the stacked structure having the first electrode 8, the organic compound layer 7 and the second electrode 5 which are stacked, and preventing water and oxygen from entering the organic compound layer 7. Usable materials include metal oxides such as silicon nitride, silicon carbide and silicon oxide, metals and organic resins.

In the present invention, the sealing member is indispensable but the protective layer may be provided.

Hereafter, Examples of the present invention are described.

EXAMPLE 1

The inside of a 500 ml-flask equipped with a nitrogen inlet tube and a cooling tube is replaced with a nitrogen gas. In the flask, placed are 100 g of styrene monomer (manufactured by Kishida Chemical Co., Ltd.); 100 g of butyl methacrylate (manufactured by Kishida Chemical Co., Ltd.); 200 ml of dehydrated dimethylformamide (manufactured by Kishida Chemical Co., Ltd.); and 20 g of azobisisobutyronitrile (manufactured by Kishida Chemical Co., Ltd.), from all of which dehydration treatment and removal of polymerization inhibitors have been conducted. After the inside of the flask is replacement with a nitrogen gas, the obtained mixture is heated to 80° C. and stirred for 5 hours. The resultant liquid is poured into a beaker containing 1 L of methanol for reprecipitation. The obtained solid product is cleaned with methanol, and heated and dried under vacuum to obtain 145 g of poly(styrene-butyl methacrylate) as a polymer.

100 g of the obtained polymer is heated and dried under high vacuum to remove water, and then added to a solution prepared by adding octyl cyanoacrylate of Formula 2 to 200 ml of dehydrated toluene (manufactured by Kishida Chemical Co., Ltd.). The mixture is stirred to obtain a material solution 1 for a filling layer.

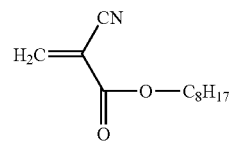

[Formula 2]

EXAMPLE 2

In Example 2, a material solution 2 for a filling layer is obtained by performing the same operations as in Example 1 except that hexafluoropentyl acrylate of Formula 3 is used instead of octyl cyanoacrylate.

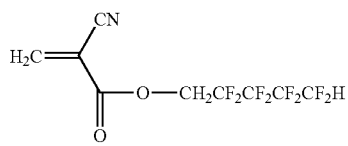

[Formula 3]

EXAMPLE 3

In Examples 3, a material solution 3 for a filling layer is obtained by performing the same operations as in Example 1 except that ethyl vinyl ether of Formula 4 is used instead of octyl cyanoacrylate, and hydrogen iodide is used as an additive.

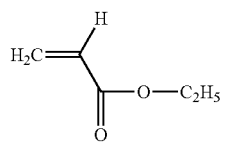

[Formula 4]

Refractive indexes of the above material solutions for a filling layer obtained in Examples 1 to 3 are measured. Films as filling layers having a thickness of 200 μm are prepared from the solutions by a casting method. Using a refractometer, refractive indexes of sodium D-lines of these films are measured at 25° C. As a result, the filling layers of Examples 1 to 3 have refractive indexes of 1.55, 1.51 and 1.45, respectively.

EXAMPLE 4

The filling layers are mounted on top emission type organic EL devices.

First, a TFT, an organic planarizing layer and a chromium electrode are formed on a glass substrate, and the surrounding thereof is insulated with a device isolation film made of polyimide. The thus-obtained substrate is used. On the chromium electrode, formed is an organic compound layer having a hole transport layer, a light-emitting layer, an electron transport layer and an electron injection layer in this order is formed. Then, on the organic compound layer, an ITO transparent electrode having a thickness of 200 nm is formed by a sputtering method to provide a stacked structure. Further, a silicon nitride film with a thickness of 1 µm is formed by a VHF plasma CVD method as a protective layer so as to cover the stacked structure to obtain an organic EL device substrate. In addition, as a sealing glass, prepared is a glass substrate in which glass except a peripheral part of one side is removed to a depth of 100 µm by etching.

The above material solution 1 for a filling layer is poured on the sealing glass, and a solvent of toluene is removed under reduced pressure. The obtained sealing glass is bonded with the above-described organic EL device substrate having up to the protective layer formed thereon.

Thereafter, the peripheral part of the sealing glass is sealed with an ultraviolet curable adhesive by a precision dispenser. Only the adhesive is irradiated with an ultraviolet ray having a radiation strength of 100 mW/cm$^2$ by a metal halide lamp in a wavelength range of 300 to 390 nm so as to have a radiation dose of 6000 mJ/cm$^2$, thereby producing an organic EL device.

These sealing steps are conducted in a glove box (not shown) having a controlled water concentration of 10 ppm or less, and care should be taken to minimize the deterioration of an organic EL device due to water during the steps.

EXAMPLE 5 and 6

In Examples 5 and 6, organic EL devices are produced by performing the same operations as in Example 4 except that material solutions 2 and 3 for a filling layer are used for Examples 5 and 6, respectively, instead of the material solution 1 for a filling layer.

EXAMPLE 7

The above filling layers are mounted on bottom emission type organic EL device.

First, a TFT, an organic planarizing layer and an ITO electrode are formed under a glass substrate, and the surrounding thereof is insulated with a device isolation film made of polyimide. The thus-obtained substrate is used. Under the ITO electrode, formed is an organic compound layer having a hole transport layer, a light-emitting layer, an electron transport layer and an electron injection layer in this order. Then, under the organic compound layer, a chromium transparent electrode having a thickness of 100 nm is formed by a sputtering method to provide a stacked structure. Further, a silicon nitride film with a thickness of 1 µm is formed by a VHF plasma CVD method as a protective layer so as to cover the stacked structure to obtain an organic EL device substrate.

The above material solution 1 for a filling layer is poured in a sealing can, and a solvent of toluene is removed under reduced pressure until the sealing can is filled with a filling agent. The obtained sealing can is bonded with the above-described organic EL device substrate having up to the protective layer formed thereon.

Thereafter, the peripheral part of the sealing can is sealed with an ultraviolet curable adhesive by a precision dispenser. Only the adhesive is irradiated with an ultraviolet ray having a radiation strength of 100 mW/cm$^2$ by a metal halide lamp in a wavelength range of 300 to 390 nm so as to have a radiation dose of 6000 mJ/cm$^2$, thereby producing an organic EL device.

These sealing steps are conducted in a glove box (not shown) having a controlled water concentration of 10 ppm or less, and care should be taken to minimize the deterioration of an organic EL device due to water during the steps.

Comparative Example 1

Only poly(styrene-butyl methacrylate) of Example 1 as a polymer is used as a material for a filling layer, and the same operations as in Example 4 are performed, thereby producing an organic EL device having a filling layer of only a poly (styrene-butyl methacrylate) as a polymer.

The above organic EL devices produced in Examples 4 to 7 and Comparative Example 1 are allowed to stand at 60° C. and 90% relative humidity for 500 hours, and thereafter observed in terms of VI characteristics, luminance characteristics and the presence of dark spot. The organic EL devices of Examples 4 to 7 exhibit no changes on the above items before and after being allowed to stand. However, the deterioration of VI characteristics, the decrease of luminance, and many dark spots are observed on the organic EL device of Comparative Example 1. These results have revealed that the material of the present invention for a filling layer prevents water from entering an organic EL device.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-191123, filed Jul. 12, 2006, which is hereby incorporated by reference herein in its entirety.

What is claimed is:

1. An organic electroluminescence device comprising:
   a substrate;
   a stacked structure having at least a first electrode, a light-emitting layer and a second electrode which are stacked on the substrate;
   a sealing member for sealing the substrate and the stacked structure; and
   a layer containing a water-polymerizable monomer and provided between the stacked structure and the sealing member.

2. The organic electroluminescence device according to claim 1, wherein the monomer is an ion-polymerizable monomer.

3. The organic electroluminescence device according to claim 1, wherein the monomer is either one of a cyanoacrylate-based monomer and a vinylether-based monomer.

4. The organic electroluminescence device according to claim 1, wherein the monomer is dispersed in the layer.

5. The organic electroluminescence device according to claim 1, wherein the layer containing the water-polymerizable monomer has a refractive index of 1.3 or more.

6. The organic electroluminescence device according to claim 1, further comprising a protective layer for protecting an external surface of the stacked structure.

* * * * *